United States Patent
Co et al.

(10) Patent No.: US 6,351,827 B1
(45) Date of Patent: *Feb. 26, 2002

(54) VOLTAGE AND CLOCK MARGIN TESTING OF MEMORY-MODULES USING AN ADAPTER BOARD MOUNTED TO A PC MOTHERBOARD

(75) Inventors: Ramon S. Co, Trabuco Canyon; Tat Leung Lai, Torrance; Thang Nguyen, Santa Ana, all of CA (US)

(73) Assignee: Kingston Technology Co., Fountain Valley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/702,018

(22) Filed: Oct. 30, 2000

Related U.S. Application Data

(63) Continuation-in-part of application No. 09/056,973, filed on Apr. 8, 1998, now Pat. No. 6,178,526.

(51) Int. Cl.[7] .................................................. H02H 3/05
(52) U.S. Cl. ........................................... 714/42; 714/29
(58) Field of Search ............................ 714/42, 29, 54, 714/718, 767; 711/115, 170, 173; 710/102, 103

(56) References Cited

U.S. PATENT DOCUMENTS

| | | | |
|---|---|---|---|
| 4,488,297 A | | 12/1984 | Vaid ................................ 371/1 |
| 4,502,140 A | | 2/1985 | Proebsting .................... 371/28 |
| 4,675,562 A | | 6/1987 | Herlein et al. ............... 307/602 |
| 4,992,850 A | * | 2/1991 | Corbett et al. ............... 257/203 |
| 5,184,068 A | * | 2/1993 | Twigg et al. ................. 324/755 |
| 5,224,023 A | * | 6/1993 | Smith et al. ................. 361/784 |
| 5,228,039 A | * | 7/1993 | Knoke et al. ................. 714/28 |
| 5,301,343 A | * | 4/1994 | Alvarez ....................... 711/170 |
| 5,357,519 A | * | 10/1994 | Martin et al. ................. 714/25 |
| 5,423,028 A | * | 6/1995 | Schieve et al. ............... 714/42 |
| 5,450,576 A | * | 9/1995 | Kennedy ........................ 713/2 |
| 5,467,040 A | | 11/1995 | Nelson et al. ............... 327/276 |
| 5,471,877 A | | 12/1995 | Brown ......................... 73/571 |
| 5,519,832 A | * | 5/1996 | Warchol ....................... 714/46 |
| 5,533,194 A | * | 7/1996 | Albin et al. ................... 714/42 |
| 5,559,739 A | | 9/1996 | DeBrosse et al. ....... 365/189.01 |
| 5,581,712 A | * | 12/1996 | Herrman ..................... 710/103 |
| 5,611,436 A | * | 3/1997 | Ashby ......................... 209/573 |
| 5,655,083 A | * | 8/1997 | Bagley ......................... 714/23 |
| 5,655,106 A | * | 8/1997 | Smith ......................... 395/500 |
| 5,659,680 A | | 8/1997 | Cunningham et al. . 395/183.01 |
| 5,663,968 A | | 9/1997 | Heuer ........................... 371/28 |
| 5,704,489 A | * | 1/1998 | Smith ........................... 209/2 |
| 5,706,300 A | * | 1/1998 | Wedel ......................... 714/724 |
| 5,852,617 A | * | 12/1998 | Mote, Jr. ..................... 714/726 |
| 5,862,320 A | * | 1/1999 | Nelsen et al. .......... 395/183.18 |
| 6,026,040 A | | 2/2000 | Beigel et al. ................ 365/201 |
| 6,037,792 A | | 3/2000 | McClure ..................... 324/760 |
| 6,046,421 A | * | 4/2000 | Ho ............................. 209/573 |
| 6,092,030 A | | 7/2000 | Lepejian et al. .............. 702/79 |
| 6,092,146 A | * | 7/2000 | Dell et al. ..................... 711/5 |
| 6,122,756 A | * | 9/2000 | Baxter et al. ................. 714/30 |
| 6,175,774 B1 | * | 1/2001 | Frank et al. .................. 700/79 |

* cited by examiner

Primary Examiner—Dieu-Minh Le
(74) Attorney, Agent, or Firm—Stuart T. Auvinen

(57) ABSTRACT

Margin testing of memory modules uses a personal computer (PC) motherboard. A test adaptor board has a test socket that receives a memory module under test. Pins from the test adaptor board are plugged into holes of a removed memory-module socket on the motherboard, mounted on the reverse, solder side of the motherboard. The test adapter board has a voltage regulator that controls the power-supply (Vcc) voltage applied to the module under test. A delay circuit on the test adapter board varies the phase delay of a clock to the memory module under test. Margin control signals are generated by a controller card in the PC's expansion slots, to control Vcc and clock delay to the module under test without changing the motherboard's Vcc voltage. The test program executing on the PC motherboard writes to the controller card to adjust voltage and delay, allowing Vcc and setup and hold margins to be tested.

20 Claims, 8 Drawing Sheets

VOLTAGE AND CLOCK MARGIN TESTING OF MEMORY-MODULES USING AN ADAPTER BOARD MOUNTED TO A PC MOTHERBOARD

RELATED APPLICATION

This application is a continuation-in-part of the application for "Testing Memory Modules with a PC Motherboard Attached to a Memory-Module Handler by a Solder-Side Adaptor Board", U.S. Ser. No. 09/056,973, filed Apr. 8, 1998, now U.S. Pat. No. 6,178,526. B1

FIELD OF THE INVENTION

This invention relates to electronic test systems, and more particularly to margin testing of memory modules including SIMMs and DIMMs.

BACKGROUND OF THE INVENTION

Testing of electronic circuits and systems is of critical importance. Electronic systems are usually mass-produced, and a small percentage of the systems produced are expected to fail. Testing ensures that those failing systems do not reach customers.

Electronic systems are described by various specifications that detail voltages to be applied to inputs, timing of signals, and temperatures of operation. Gross failures are quickly detected by a large power consumption or inability to generate expected outputs when a sequence of inputs is applied. While such major failures are easily detected, more subtle failures can also occur. For example, the system can meet all specifications at a nominal temperature, but at the maximum operating temperature it fails some of the timing requirements. A higher than normal resistance in an internal signal path could cause such a failure. A higher than normal resistance causes greater signal delay. At an elevated temperature, the resistance becomes even higher causing an even greater signal delay. This could result in a violation of timing requirements such as setup and hold times. For example, a greater than normal delay for a specific signal that is part of a data bus will have more skew relative to the other bits of the data bus. The system could operate within specifications when the typical Vcc power-supply voltage (Vcc) is applied, but fails some timing specifications when the minimum-specified Vcc is applied.

Electronic systems or parts that have such subtle failures are known as marginal parts, since they fail only at the margins or extremes of the specified operating conditions. Detecting such marginal parts is desirable, since such parts, if undetected, could be used in larger systems and cause these to fail. Automatic test equipment has been used to detect such failures, by applying varying voltages to the parts being tested. The temperature of the parts under test can also be adjusted by heating or cooling devices.

One of the most important of electronic parts is the dynamic-random-access memory (DRAM). DRAM memory chips are often mounted on small, removable memory modules. The original single-inline memory modules (SIMMs) have been replaced with dual-inline memory modules (DIMMs), and 184-pin RIMMs (Rambus inline memory modules) and 184-pin DDR (double data rate) DIMMs.

The memory-module industry is very cost sensitive. Testing costs are significant, especially for higher-density modules. Specialized, high-speed electronic test equipment is expensive, and the greater number of memory cells on high-speed memory modules increases the time spent on the tester, increasing costs.

Handlers for integrated circuits (ICs) have been used for many years in the semiconductor industry. Handlers accept a stack of IC chips that are fed, one at a time, to the tester. The tested IC is then sorted into a "bin" for IC chips that have passed or failed the test. More recently, handlers have been made for memory modules. U.S. Pat. No. 5,704,489 by Smith, describes in detail a "SIMM/DIMM Board Handler" such as those in use today.

FIG. 1 shows a SIMM handler connected to a high-speed electronic tester. Memory modules 18 to be tested are loaded into the top of handler 10 in the input stack. Memory modules 18 drop down, one-by-one, into testing area. Module-under test MUT 20 is next to be tested. Arm 26 pushes MUT 20 laterally until it makes contact with contactor pins 16 that clamp down on "leadless" connector pads formed on the substrate of MUT 20.

Contactor pins 16 are also connected to test head 14, which makes connection to tester 12. Tester 12 executes parametric and functional test programs that determine when MUT 20 falls within specified A.C. and D.C. parameters, and whether all memory bit locations can have both a zero and a one written and read back. Margin testing can be performed on some testers by varying voltages applied to different pins of the device being tested.

Tester 12 can cost from ten-thousand to millions of dollars. Cost can be reduced if a less-expensive tester replaces tester 12. Since most memory modules are intended for installation on personal computers (PCs), some manufacturers test memory modules simply by plugging them into SIMM or DIMM sockets on PC motherboards. A test program is then executed on the PC, testing the inserted module. Since PCs cost only about a thousand dollars, tester 12 and handler 10 of FIG. 1 are replaced by a lowcost PC. Equipment costs are thus reduced by a factor of a hundred.

FIG. 2 shows a PC motherboard being used to manually test memory modules. Substrate 30 is a motherboard. Components 42, 44, mounted on the top side of substrate 30, include ICs such as a microprocessor, logic chips, buffers, and peripheral controllers. Sockets for expansion cards 46 are also mounted onto the top or component side of substrate 30.

Memory modules 36 are SIMM or DIMM modules that fit into SIMM/DIMM sockets 38. SIMM/DIMM sockets 38 (hereinafter SIMM sockets 38) have metal pins that fit through holes in substrate 30. These pins are soldered to solder-side 34 of substrate 30 to rigidly attach SIMM sockets to the PC motherboard. Both electrical connection and mechanical support are provided by SIMM sockets 38.

Margin Conditions Would Cause PC Motherboard to Fail First

While using PC motherboards for testing memory modules greatly reduces equipment costs, margin testing is not performed. The SIMM sockets are integral with the substrate 30 of the PC motherboard, preventing variation of voltages applied to a memory module being tested in one of the sockets 38. The power-supply voltage (Vcc) to the entire PC motherboard could be varied, causing the Vcc to the memory module under test in socket 38 to also be varied. However, since the PC motherboard has so many components, increasing the power-supply voltage to the PC motherboard would likely cause failures in the motherboard components before failures occurred in the memory module being tested.

Likewise, hot air could be blown on the memory module being tested in socket 38. While this hot air would heat the module under test, it would also heat the PC motherboard and its components near socket 38, perhaps heating all of the motherboard to some extent. This heating is likely to cause failures of components 42, 44, or of solder and wiring connections, before the memory module fails. Thus margin testing of a memory module being tested in socket 38 is problematic.

The parent application teaches a small daughter card known as a test adapter board that is attached to the reverse side of the PC motherboard. The reverse-side attachment of the test adapter board facilitates attachment of the SIMM/DIMM handler, since the front side of the PC motherboard is too crowded for attaching the handler. The inventors realized that the back or solder-side of the PC motherboard is less crowded and provides unobstructed access.

The PC motherboard is modified to provide reverse attachment of the handler to the solder-side of the PC motherboard using the handler adapter board. The SIMM socket on the component side of the PC motherboard is removed, and the handler adapter board is plugged from the backside into the holes on the PC motherboard for the SIMM socket.

Handler Mounted Close to PC Motherboard—FIG. 3

FIG. 3 shows a SIMM/DIMM handler mounted close to the backside of the PC motherboard using the handler adaptor board. Handler 10 is not drawn to scale since it is several times larger than a PC motherboard. However, FIG. 3 does highlight how handler 10 can fit close to the removed SIMM socket. Such close mounting reduces loading and facilitates high-speed testing.

Contactor pins 16 within handler 10 clamp down onto leadless pads on the edge of module-under-test MUT 20 when arm 26 pushes MUT 20 into place for testing. Contactor pins 16 are electrically connected to connectors on the backside of handler 10. These connectors are edge-type connectors that normally connect with high-speed testers. Typically two connectors are provided. These male-type connectors fit into female-type connectors 54 mounted on handler adaptor board 50. Handler adaptor board 50 contains metal wiring traces formed therein that route signals from connectors 54 to adaptor pins 52 that protrude out the other side of handler adaptor board 50.

Adaptor pins 52 can be plugged into female pins 57 that are soldered onto solder-side 34 of the PC motherboard. Female pins 57 have extensions that fit into the through-holes exposed by removal of the SIMM socket, but also have cup-like receptacles for receiving adaptor pins 52. Using female pins 57 allows handler adaptor board 50 to be easily removed from substrate 30.

Once MUT 20 has been tested by a test program running on the PC motherboard, MUT 20 is sorted and drops down into either good bin 22 or bad bin 24. Sorting is in response to a pass/fail signal from the test program running on the PC motherboard.

Handler adaptor board 50 provides electrical connection from the module-under-test (MUT) in handler 10 to the removed SIMM socket on the PC motherboard. Handler adaptor board 50 provides a slight spacing or offset from the solder-side 34 surface of substrate 30, allowing handler 10 to be plugged directly into connectors 54 on handler adaptor board 50. Since the offset of adaptor board 50 is slight, the length of electrical connections to the handler is short, minimizing added loading on the PC's memory bus. The relatively flat surface of solder-side 34 allows close mounting of the SIMM/DIMM handler to the PC motherboard.

Margin Testing Desirable

While the invention described in the parent application has been quite effective, further improvements are desired. In particular, margin testing of the memory module is desirable. A modification to the test adapter board that facilitates margin testing by varying voltages and signal timing applied to the memory module is desirable.

Reliability of the tested memory modules is improved with such margin testing. It would be desirable to vary voltages to only the memory modules being tested, while not varying voltages on the motherboard and to its components. Then failures that occurred are likely to be due to the memory module itself and not the motherboard.

DETAILED DESCRIPTION

The present invention relates to an improvement in memory-module margin testing. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors realize that connecting the memory-module being tested through a test adapter board also facilitates margin testing. The inventors realize that circuits can be added to the test adapter board to facilitate margin testing. In particular, a voltage regulator can be added to the test adapter board to vary the power-supply Vcc voltage applied to the memory module under test. The power-supply voltage on the PC motherboard is not affected, only the Vcc voltage applied to the memory module is varied.

Likewise, delay circuits can be inserted on signal paths on the test adapter board. These delay circuits allow for adjustment of signal timing of inputs to the memory module being tested. Certain timing margins can then be tested for without affecting motherboard timing. Higher reliability parts can then be produced at low cost, using a PC-motherboard tester rather than an expensive automated-test-equipment (ATE) tester.

Figure 1:
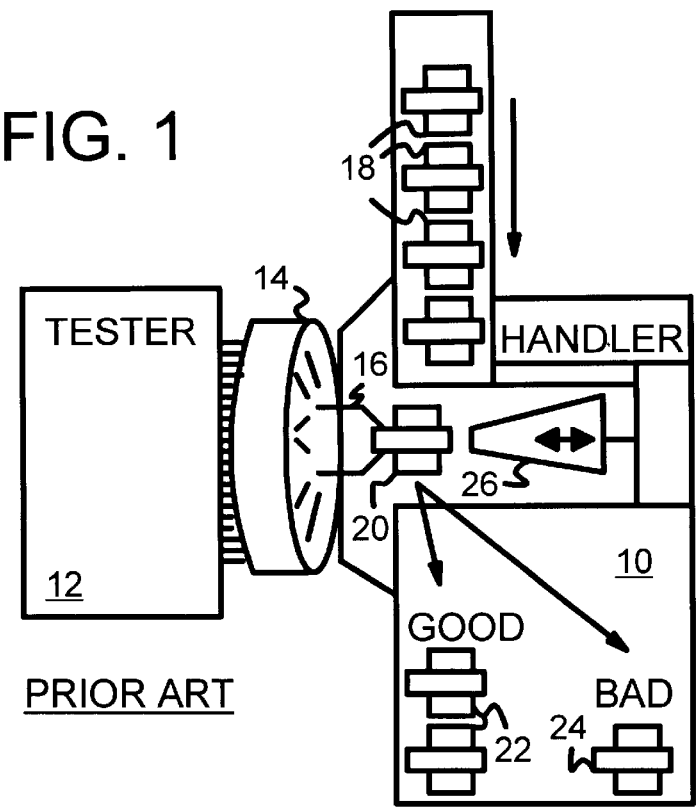
FIG. 1 shows a SIMM handler connected to a high-speed electronic tester.
Figure 2:
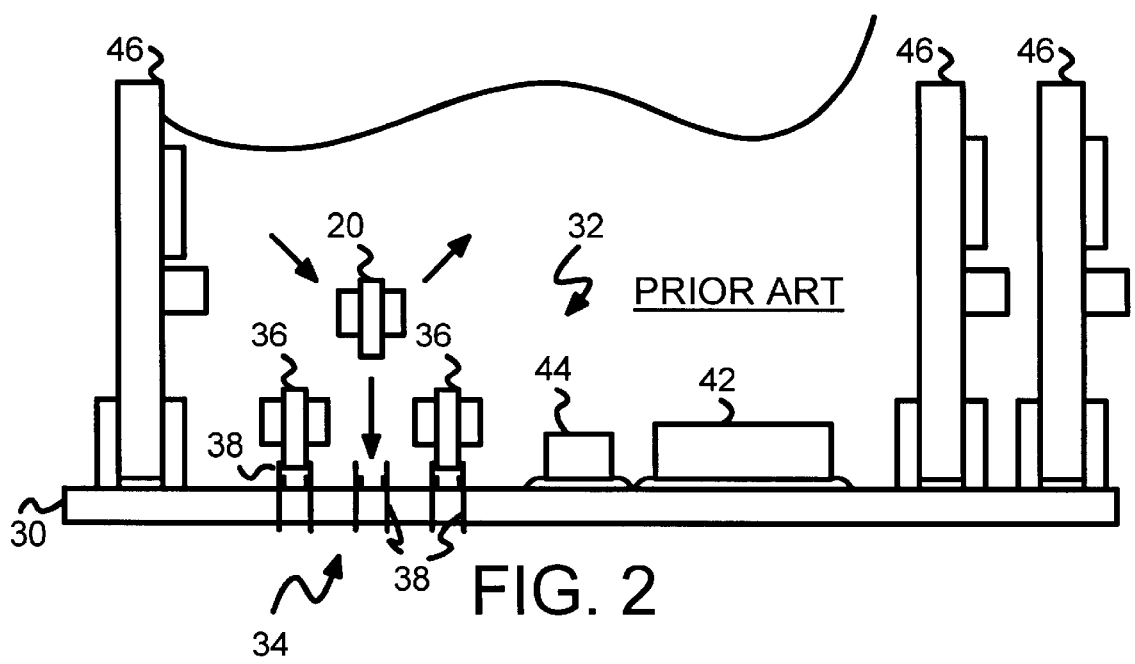
FIG. 2 shows a PC motherboard being used to manually test memory modules.
Figure 3:
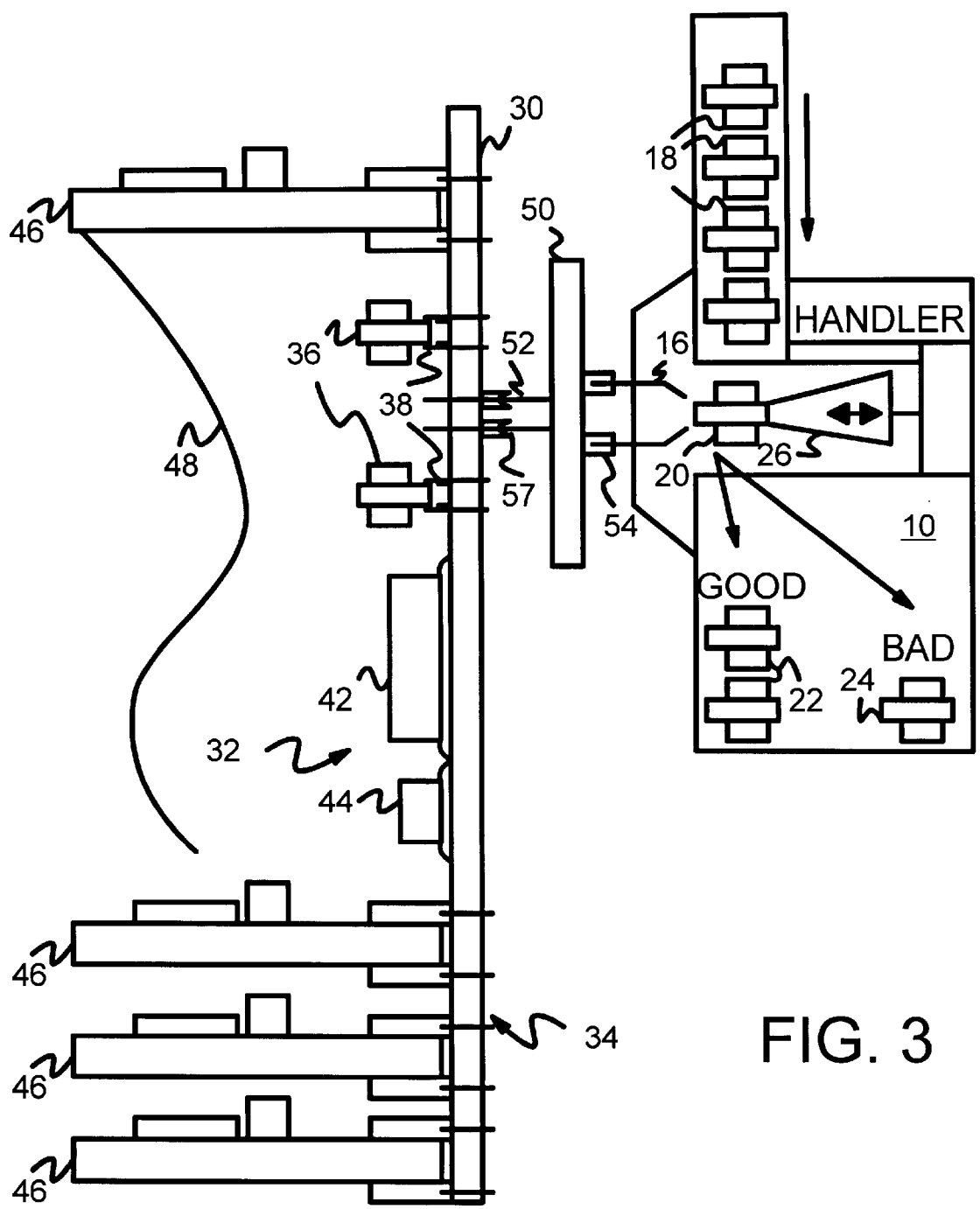
FIG. 3 shows a SIMM/DIMM handler mounted close to the backside of the PC motherboard using the handler adaptor board.
Figure 4:
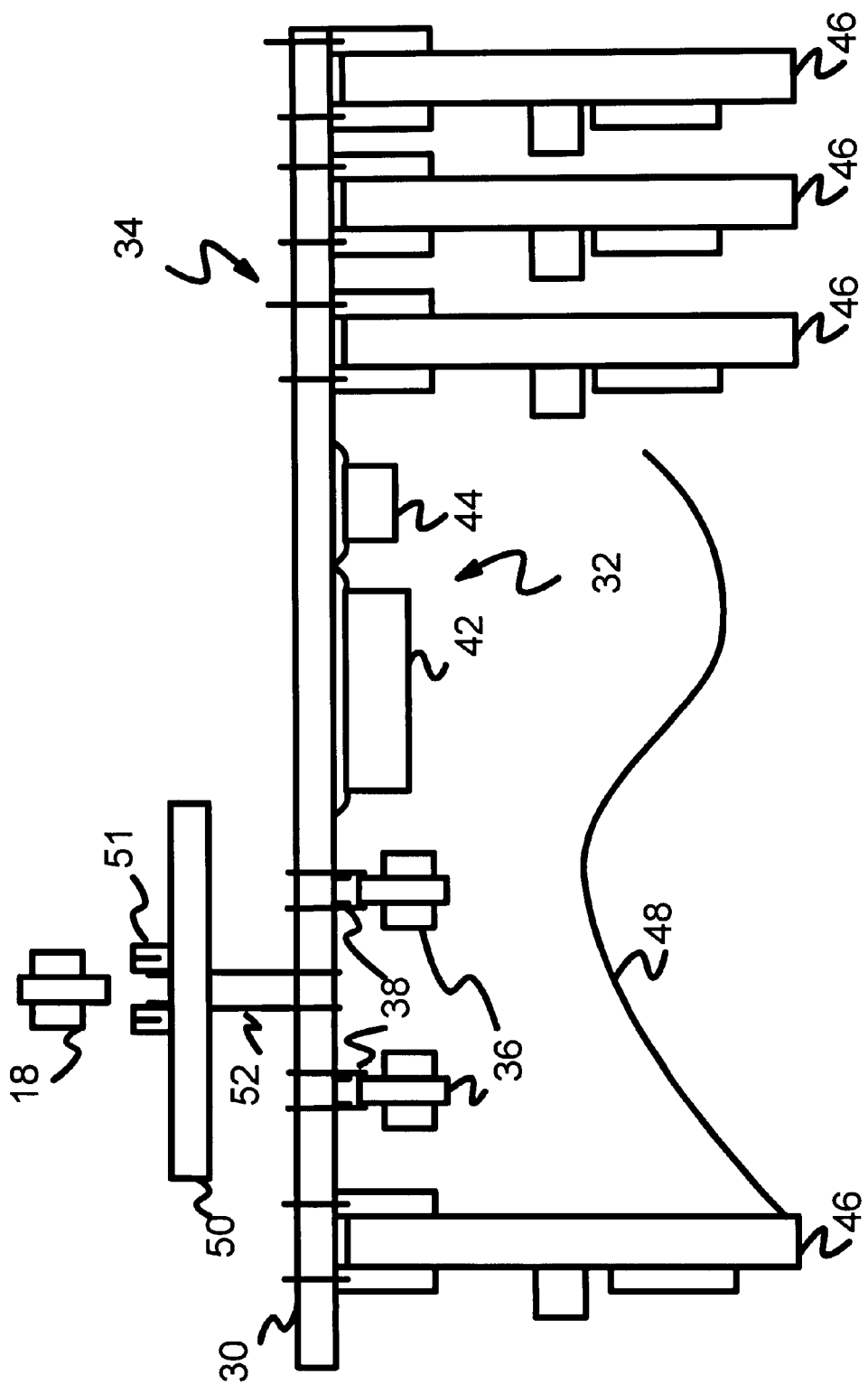
FIG. 4 illustrates an adapter board with a SIMM/DIMM socket mounted onto the solder-side of a PC motherboard using the original holes for a SIMM or DIMM socket.

Adaptor Board Reverse-Mounted to PC Motherboard—FIG. 4

FIG. 4 illustrates an adapter board with a SIMM/DIMM socket mounted onto the solder-side of a PC motherboard using the original holes for a SIMM or DIMM socket. Substrate 30 of the PC motherboard is a conventional multi-layer epoxy-fiberglass circuit board. Components 42, 44 are mounted on component-side 32 of substrate 30.

Memory modules 36 are SIMM or DIMM modules that fit into SIMM/DIMM sockets 38. SIMM/DIMM sockets 38 hereinafter SIMM sockets 38) have metal pins that fit through holes in substrate 30. Expansion cards 46 are plugged into expansion sockets that are also mounted onto component-side 32 of substrate 30. Cables 48 and expansion cards 46 obstruct access to memory modules 36. A robotic arm would be unable to insert and remove memory modules from sockets 38 on the component side of substrate 30 due to the obstruction of cables 48 and expansion cards 46.

Test adapter board 50 is a small epoxy-glass circuit board designed to allow an automated handler, a person, or a robotic arm easy access to SIMM/DIMM test socket 51 that is mounted on adaptor board 50. Test socket 51 on one surface of test adapter board 50 mates with connectors on SIMM/DIMM memory module 18, the module-under test. The other surface of adaptor board 50 has adapter pins 52 protruding through. These adaptor pins are soldered into through-holes in adaptor board 50. Adapter pins 52 are arranged to have the same arrangement and spacing as the substrate-mounting pins for SIMM sockets 38.

SIMM Socket Removed on Front-Side

One or more of SIMM sockets 38 has been removed from the component side of the PC motherboard, leaving the through-holes. Adapter pins 52 are then fitted through the exposed through holes for the removed SIMM socket. Rather than push the pins through from component-side 32, adapter pins 52 are pushed through from solder-side 34 to component-side 32. Adapter pins 52 are then be soldered to substrate 30.

Test adaptor board 50 provides electrical connection from the module-under-test (MUT) in the SIMM/DIMM test socket 51 to the leads for the removed SIMM socket on the PC motherboard. Test adaptor board 50 provides a slight spacing or offset from the solder-side 34 surface of substrate 30, allowing a handler, person, or robotic arm to easily reach test socket 51 and plug memory module 18 under test directly into test socket 51 on adaptor board 50. Since the offset of adaptor board 50 is slight, the length of electrical connections to the motherboard is short, minimizing added loading on the PC's memory bus. Also minimized is signal discontinuity due to the slightly different characteristic impedance compared with the metal traces on substrate. The relatively flat surface of solder-side 34 allows close mounting of SIMM/DIMM test socket 51 to the PC motherboard.

Figure 5:
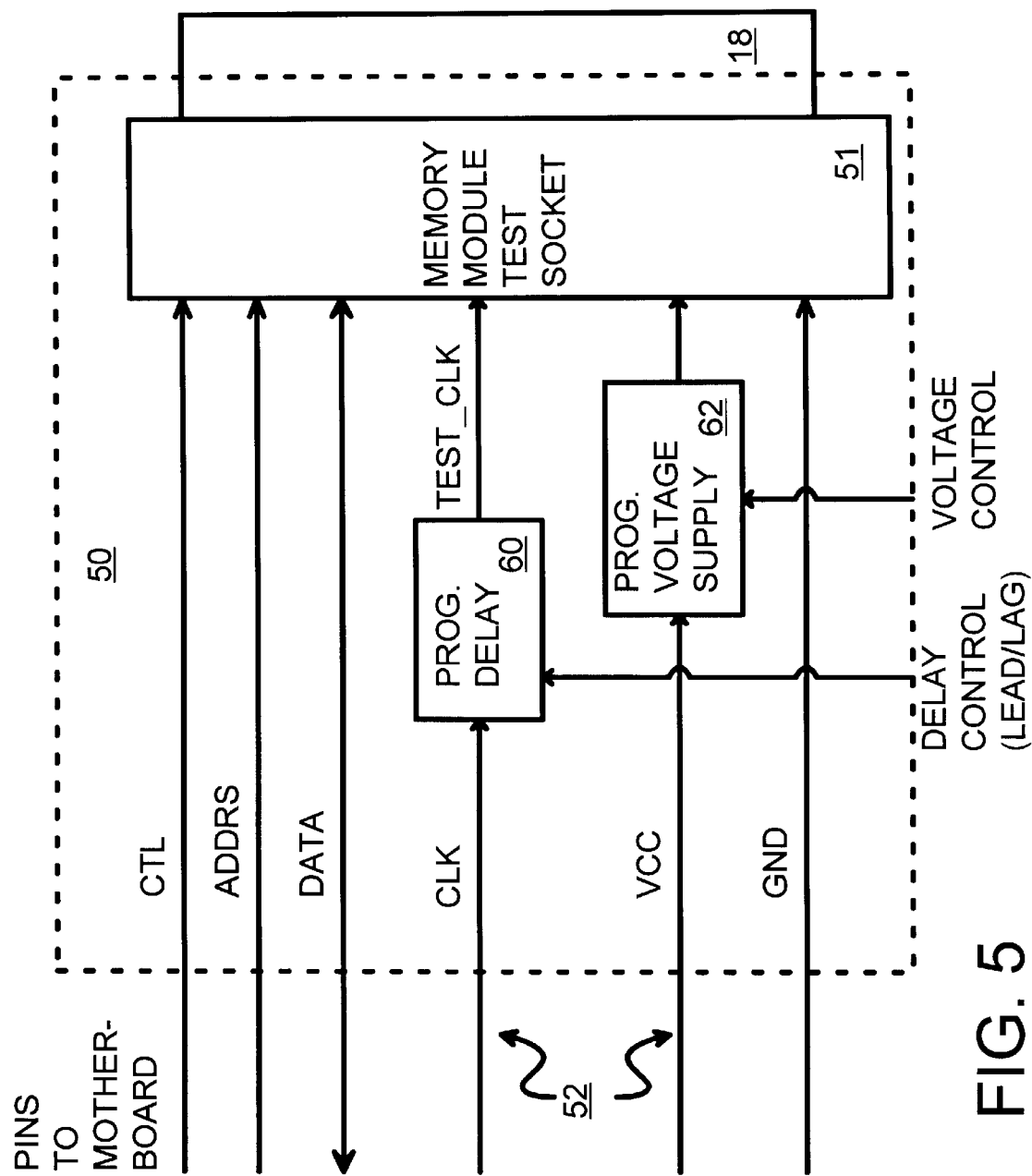
FIG. 5 is a schematic of a test adapter board with added margin-test circuits.

Test Adapter Board with Margin-Test Circuits—FIG. 5

FIG. 5 is a schematic of a test adapter board with added margin-test circuits. Test adapter board 50 receives address, data, control, and power and ground signals over pins 52 from the PC motherboard. Test adapter board 50 has test connector or socket 51 mounted thereon. Test socket 51 is a high-quality low- or zero-insertion-force socket when memory module 18 is inserted directly into socket 51, or a connector to a handler when the memory module remains in the SIMM handler.

Some signals from pins 52 are connected directly to test socket 51, such as the address and data signals, and ground. Most of the control signals, such as RAS and CAS or OE, are also directly connected. However, the clock signal CLK is altered by delay circuit 60. Many memory modules use synchronous DRAMs that include a clock input. The data signals must meet setup and hold times to this clock for the DRAM specification to be met. For non-synchronous DRAMs, delay circuit 60 can be applied to other control signals, such as RAS or CAS.

Delay circuit 60 adjusts the delay or phase of the clock (TEST_CLK) to test socket 51. In some embodiments, the frequency of the clock can also be varied by delay circuit 60. The amount of delay added or frequency adjustment is programmable. The delay control signal can be driven by a programmable register on test adapter board 50, or by a programmable register or microcontroller on a controller card that is inserted into one of the expansion slots on the PC motherboard, such as an AT-bus or PCI-bus slot.

The power-supply voltage Vcc to the memory module 18 in test socket 51 is also varied using programmable voltage supply 62. Programmable voltage supply 62 can be a standard voltage regulator chip, such as those available commercially. Examples of voltage regulator chips from Linear Technology Corporation of Milpitas, Calif. include the LT1585CT and LT317CT devices. The voltage output is typically set by a resistor divider. By using a digital potentiometer (a resistor chain with programmable taps) as the resistor divider, the voltage output can be controlled through a programmable register. The Vcc voltage to memory module 18 in test socket 51 is controlled by programmable voltage supply 62 in response to the voltage control input, which is also generated by a programmable register, preferably on a controller card.

The power-supply voltage to memory module 18 can be adjusted to target voltages, such as Vcc+5%, or Vcc−5%. When a voltage regulator is used, the absolute voltage desired can be programmed in, and the output Vcc is regulated to this voltage regardless of variations the input Vcc from the motherboard.

A test program executing on the PC motherboard can re-program the programmable registers on the controller card by executing an AT-bus or I/O write cycle. The new values in the programmable registers adjusts the Vcc voltage from programmable voltage supply 62 or the clock delay produced by delay circuit 60. This allows the test program to first test the module under nominal delay and Vcc conditions, then drop Vcc to a minimum-Vcc value and repeat the test, perhaps adjusting delay in increments with a program loop.

Figure 6:
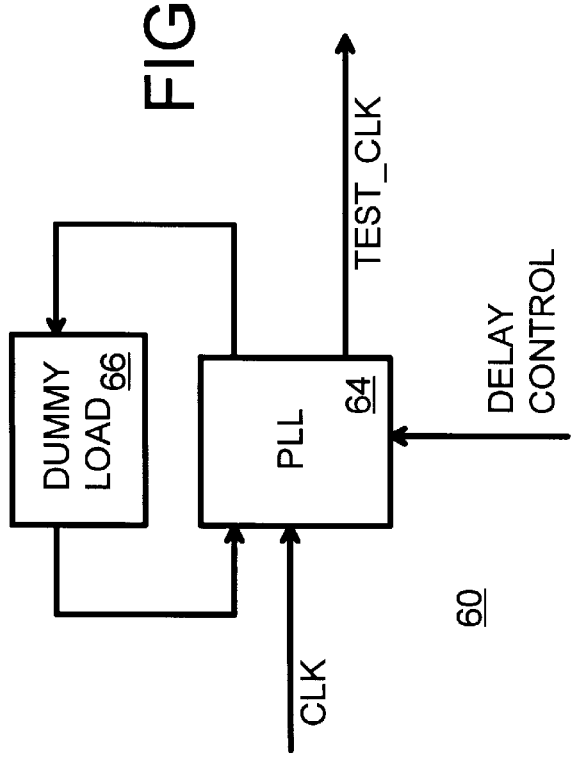
FIG. 6 shows a clock delay circuit that uses a PLL.
Figure 7:
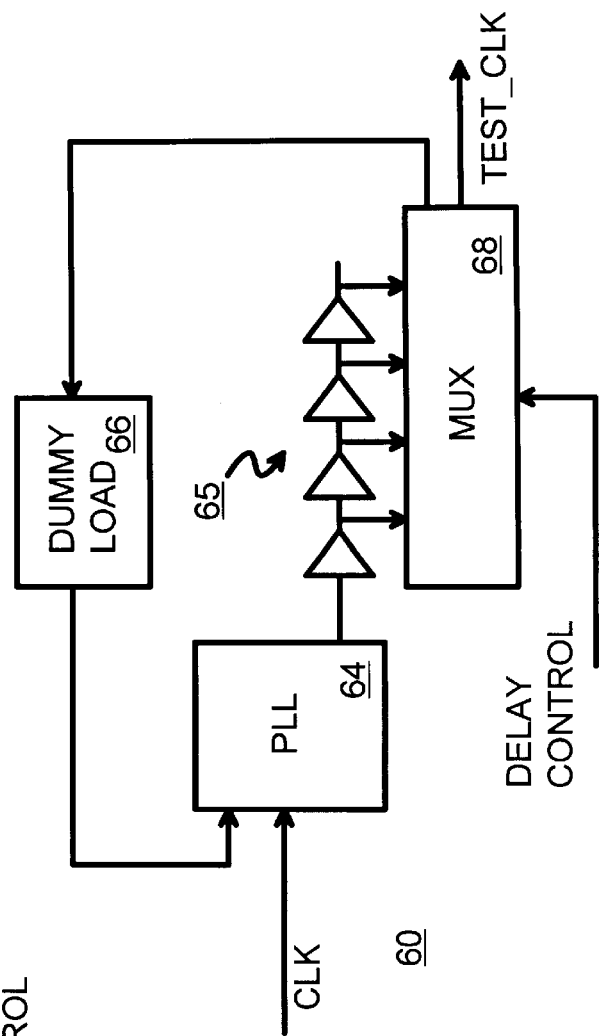
FIG. 7 shows in more detail a PLL-based delay circuit with a selectable phase delay.

Delay Circuit Using PLL—FIGS. 6, 7

A simple programmable delay line could be used as delay circuit 60. The amount of delay is programmed into the delay chip. Such delay chips are commercially available and act as programmable delay lines. For example, a programmable delay line is available from Data Delay Devices, Inc. of Clifton, N.J., as the PDV-1316F part.

Another embodiment of delay circuit 60 is to use a phase-locked loop (PLL). This allows the frequency as well as the phase delay to be changed. A stable clock can be generated because of the feedback loop. FIG. 6 shows a clock delay circuit that uses a PLL. The DRAM clock from the PC motherboard is input to open-loop PLL 64 in delay circuit 60 on the test adapter board. The feedback loop of open-loop PLL 64, which is generated by the voltage-controlled oscillator (VCO) in PLL 64, is fed through dummy load 66. Dummy load 66 can be a series resistor with a capacitor to ground, although an inductance or other kind of load can be substituted. Dummy load 66 is designed to match the loading on the clock output, TEST_CLK. The DELAY CONTROL signal is used to adjust the phase delay or frequency of the clock output by PLL 64.

FIG. 7 shows in more detail a PLL-based delay circuit with a selectable phase delay. Delay buffers 65 receive the output from open-loop PLL 64. The feedback to dummy load 66 is taken from the center of delay buffers 65 by mux 68. Mux 68 also selects the output from one of delay buffers 65 in response to the delay control signal, and outputs the selected delayed clock as TEST_CLK, the clock to the memory module in the test socket. Open-loop PLL 64 performs a phase comparison of its two inputs, and can include a charge pump, capacitive load, and VCO, or digital equivalents.

Various other embodiments of PLL-based delay circuits are possible. For example, a selectable-delay digital PLL can be used. See U.S. Pat. No. 5,502,750 by Co et al., and assigned to Pericom Semiconductor Corp. of San Jose, Calif.

Figure 8:
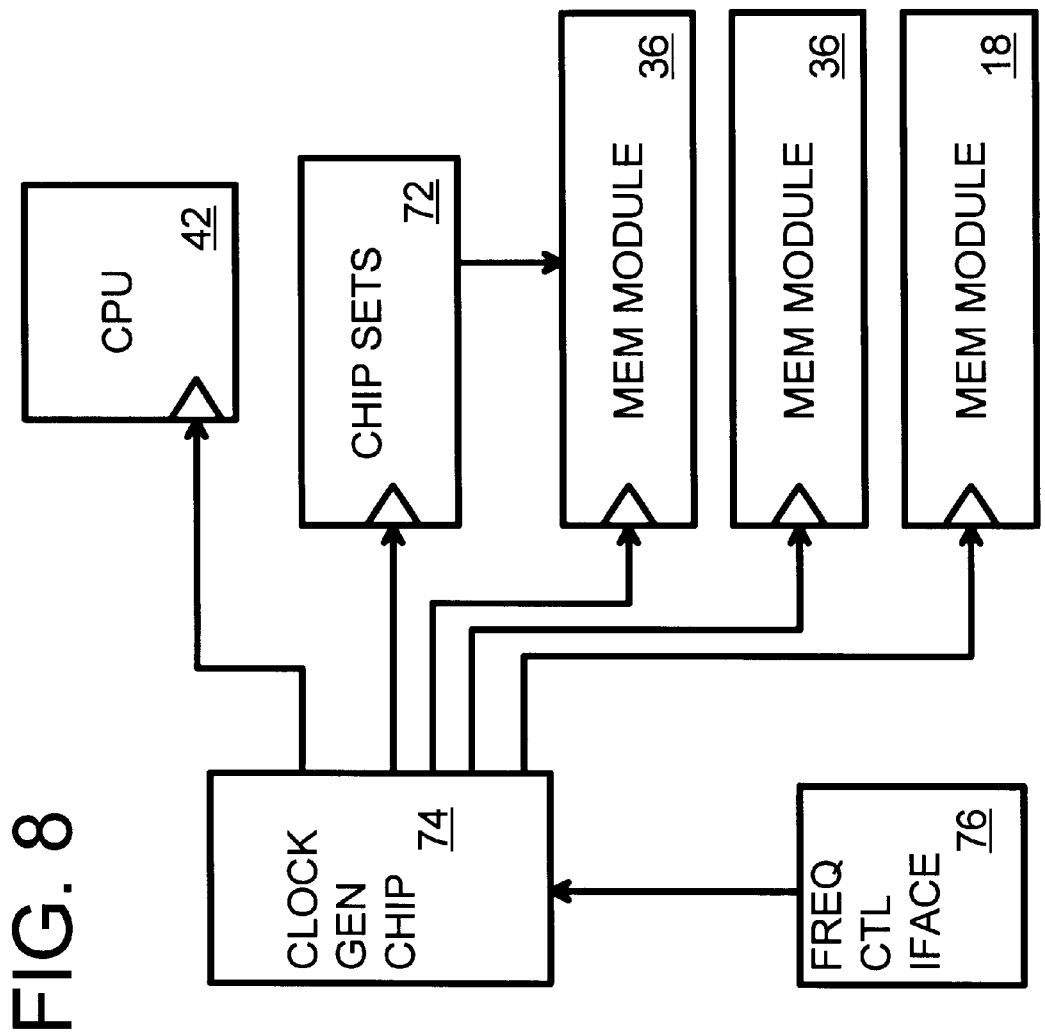
FIG. 8 shows delaying the clock to the memory module using a clock chip on the motherboard.

Delay Clock Using Clock Chip on Motherboard—FIG. 8

FIG. 8 shows delaying the clock to the memory module using a clock chip on the motherboard. Some motherboards use a programmable clock generator chip to generate a variety of clocks. This clock chip can be programmed by the test program to vary the clock to the memory module under test to perform margin testing. Use of such a motherboard clock chip can eliminate the need for delay circuit 60 on the test adaptor board. In this embodiment the programmable voltage supply is still needed on the test adaptor board when margin testing of Vcc is desired.

Clock generator chip 74 receives one or more clock inputs from frequency crystal interface 76, which typically includes one or more crystal oscillators. Clock generator chip 74 contains registers that indicate clock divisors and multiples that control dividers in PLL's within clock generator chip 74, and registers that control relative delays among the various clocks output. By programming these registers in clock generator chip 74, various clock frequencies can be generated. These programmably-controlled clock are output by clock generator chip 74, and include a central processing unit CPU clock to microprocessor CPU 42, and one or more system-logic clocks to chip sets 72. One or more DRAM clocks may also be generated to drive clock inputs of memory modules 36 on the PC motherboard and memory module 18 in the test socket on the test adapter board. The DRAM clock could also be generated by chip sets 72, which also generates various DRAM control signals such as RAS and CAS.

A test program executing in CPU 42 can include I/O write instructions to re-program the registers in clock generator chip 74 that generate the DRAM clock. The clock delay can be swept across a range to test for a range of phase delays. Ideally, a separate DRAM clock is generated for memory module 18 on the test adaptor board, so that the DRAM clock to memory modules 36 on the PC motherboard are not varied.

Figure 9:
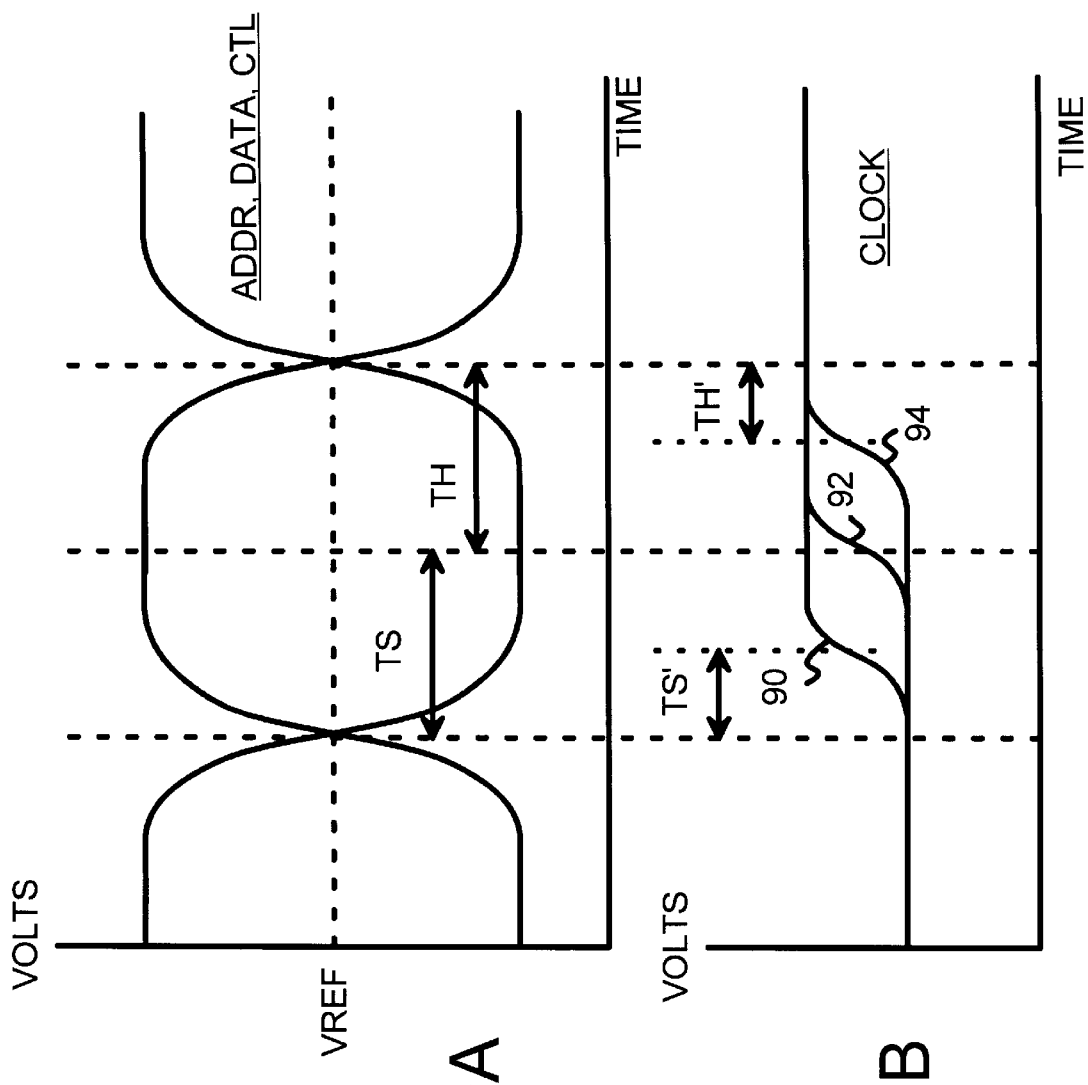
FIGS. 9A, 9B are waveforms that highlight margin testing of setup and holds times by varying a delay of the clock to the memory module being tested.

Margin Test of Setup and Hold Times—FIGS. 9A,B

FIGS. 9A, 9B are waveforms that highlight margin testing of setup and holds times by varying a delay of the clock to the memory module being tested. FIG. 9A shows a waveform of address, data, and control signals applied to the memory module being tested. These signals change at about the same time, in response to clocks in the chip sets on the motherboard. The changing of these signals is represented by the cross-over points when the signal voltages cross the reference voltage Vref. Vref is the switching threshold, which can be approximated by Vcc/2.

FIG. 9B shows the clock applied to the memory module being tested in the test adaptor board. The phase delay of this clock is adjusted by the delay circuit on the test adaptor board, or by the clock generator chip on the motherboard. Under normal conditions, the clock has the nominal delay and is shown by nominal clock 92. The address, data, and other control signals must meet specified setup and hold times to this nominal clock 92. These nominal setup and hold times are shown in FIG. 9A as TS and TH.

The delay circuit or clock generator chip can be re-programmed by the test program to reduce the clock delay so that early clock 90 is generated instead of nominal clock 92. Since the phase delay of early clock 92 is reduced, the setup time TS' is also reduced. Test patterns can be written to the memory module being tested and read back to check for errors. When errors such as data mis-match occur for early clock 90 but not for nominal clock 92, then the memory module can be rejected as a marginal part that fails the setup margin test.

Likewise, the delay circuit or clock generator chip can again be re-programmed by the test program to increase the clock delay so that late clock 94 is generated instead of nominal clock 92 or early clock 90. Since the phase delay of late clock 94 is increased, the hold time TH' is reduced. Test patterns are then written to the memory module being tested and read back to check for errors. When errors such as data mis-match occur for late clock 94 but not for nominal clock 92, then the memory module can be rejected as a marginal part that fails the hold margin test.

The amount of delay for early clock 90 and late clock 94 can be set to match the setup and hold times in the specification for the memory module being tested, or can include an additional guard-band. The test using nominal clock 92 could be skipped to reduce tester time.

The Vcc voltage can also be adjusted before the setup and hold margin tests are performed. For example, the setup and hold margin tests can be executed when Vcc is set to Vcc−5%, and then repeated for Vcc−5%.

Figure 10:
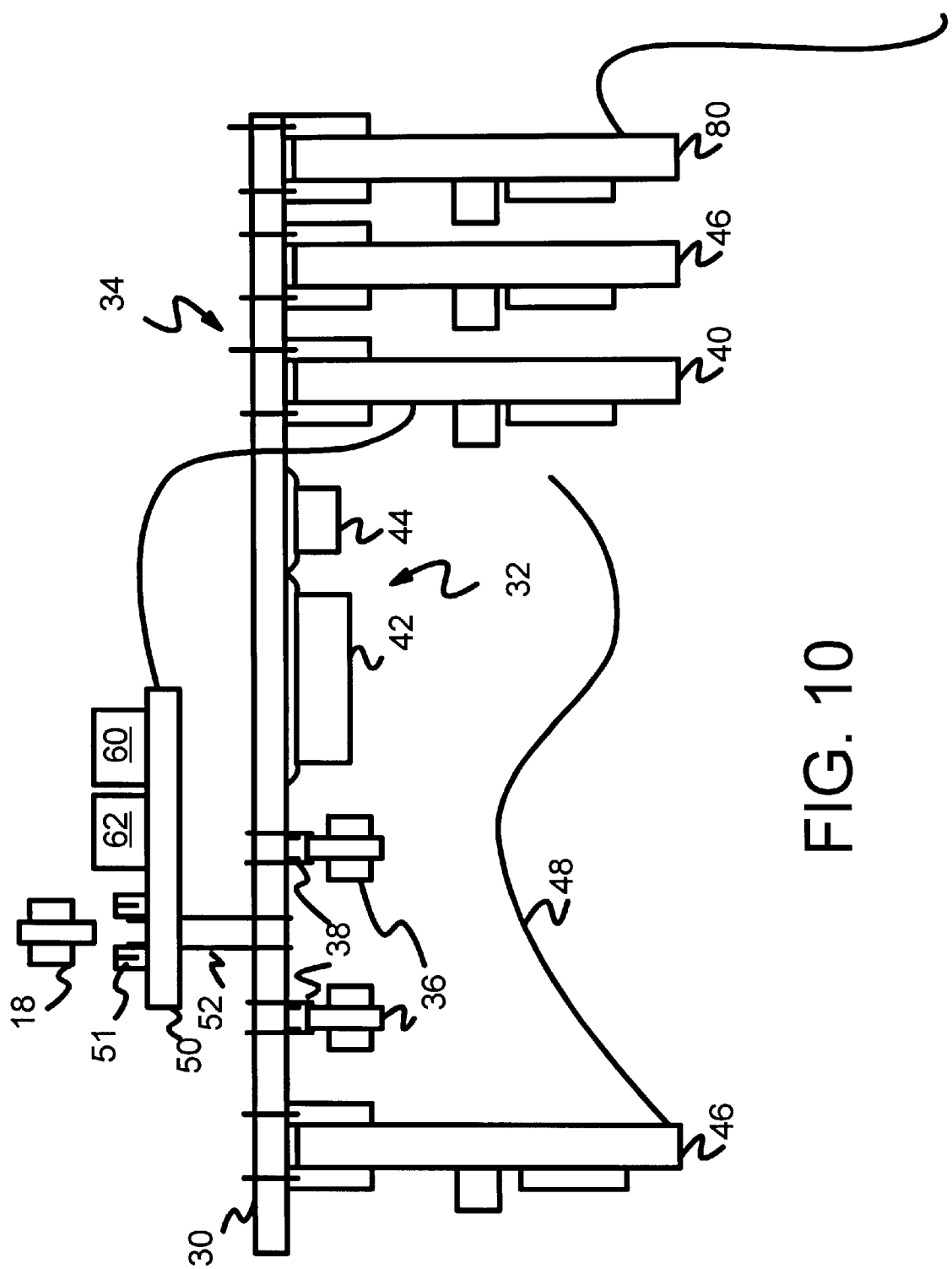
FIG. 10 shows an alternate embodiment that uses a controller card to generate control signals for the margin-test circuits on the test adapter board.

Controller Card on Modified PC Motherboard—FIG. 10

FIG. 10 shows an alternate embodiment that uses a controller card to generate control signals for the margin-test circuits on the test adapter board. The controller card can also be used to collect test statistics. The controller card 40 communicates with a test program executing on the PC's microprocessor over the expansion bus (AT/ISA, PCI, etc.) typically using message, control, and status ports. The test program itself can be transferred from a flash BIOS on controller card 40 to the main memory read by the microprocessor using the expansion bus.

Control signals for programmable voltage supply 62 and delay circuit 60 on test adapter board 50 are generated by controller card 40 installed in an expansion slot on substrate 30 on the PC motherboard. Programmable registers on controller card 40 can be written to by CPU 42 as a test program is executed by the PC motherboard. As new values are written to the programmable registers, different control signal values are generated and sent to programmable voltage supply 62 and delay circuit 60 over a cable between controller card 40 and test adapter board 50. This causes a different Vcc or clock delay to be generated for the next series of test vectors or test sequence of the test program.

Controller card 40 may also connect to a local-area-network LAN card 80, or have LAN functions built in. As the test program is executing, it also sends a pass/fail signal to LAN card 80, for transmission over a network to a central server. Many such PC motherboards with attached test adapter boards are networked together in such a fashion. The central server receives pass/fail signals from all testing stations and keeps track of statistics, such as the total passed and failed modules, test time, etc. The controller card 80 can also be used to control a handler or robotic system for inserting the memory modules being tested into the test socket.

The programmable registers may be inside a microcontroller on controller card 80, or may simply be output ports that drive the control signals, with registers on test adapter board 50 being written to. The control signals may be multi-bit digital signals, a sequence of signals sent over a serial line, or analog voltages. Many alternatives are possible.

During testing, a power relay can be used to disconnect the power supply (Vcc) to the module under test when the tester is moving a new module into position and clamping the contactor pins down onto the modules pads. Alternatively, the control signals to programmable voltage supply 62 can be changed to drop Vcc to zero when modules are removed and inserted. This allows the motherboard to continue operating without being reset or rebooted after each new memory module is inserted into the test socket on test adapter board 50.

ALTERNATE EMBODIMENTS

Several other embodiments are contemplated by the inventors. For example, many kinds of memory modules can be tested. Modules using standard DRAM or newer EDO and synchronous DRAM can be tested. The system is ideally suited for testing the highest-speed memory modules, since capacitive loading is minimized. Other memories such as RAMBUS modules, DDR modules, and PC133 synchronous modules can be tested.

Various sizes of memory in the memory module, and form factors for memory modules can be used with the invention. Different kinds and shapes of test adaptor boards can be substituted. The reverse-mounting of the test adaptor boards and the solder-side up arrangement of the test station allows a technician or operator to easily replace the test adaptor boards when necessary. Non-PC motherboards can also be used. The invention can be applied to any target system board. Multiple test sockets can be mounted on each test adapter board, or multiple test adapter boards may be mounted on a single motherboard, allowing multiple memory modules to be tested at the same time by the same motherboard acting as a tester.

The margin test could still be performed if the test adapter board were mounted to the component side of the PC motherboard, rather than the solder side. Many combinations of margins could be tested for, such as Vcc, clock delay, and temperature. Electrically insulating material may be inserted between the test adapter board and the motherboard, permitting a closer spacing.

A heating element could be added to the test adapter board. The heating element could heat the memory module in the test socket to a desired temperature for temperature margin tests. The amount of heating could be controlled by a heating voltage supplied by the controller card. A thermocouple could be included on the test adapter board to measure the temperature near the test socket. This is useful regardless of the heating or cooling method used, such as when hot or cold air is blown onto the test socket.

The pins connecting the test adaptor board to the motherboard could take on a variety of shapes and forms, and could even have a ball shape for very close spacings to the motherboard. The pins could be replaced by surface-mounting of the test adaptor board to the motherboard. A cable or wires could also be used in place of the pins. Pins from the test adapter board that plug into the motherboard can have a ring (outward-going notch and joined to the pin), which prevents it from going beyond the top surface of the test adapter board.

In another alternate embodiment, small cups or pin receptacles are inserted into the holes on the motherboard where the DRAM socket was removed. The pins from the test adapter board plug into these receptacles. In that embodiment, the pins are not soldered directly onto the motherboard. This allows for easy replacement of the motherboard or test adapter board.

The test assembly can be flipped, rotated, turned or otherwise changed in orientation so that the test socket faces to the side or downwardly. The invention can operate in a variety of such orientations, and the description has used an upward orientation for convenience and clarity. When the orientation is altered interpretations of spatial descriptions such as "above" and "below" can be adjusted accordingly. Multiple test assemblies of motherboards and test adapter boards can be mounted on a bigger chassis with multiple cavities.

Additional delay circuits can be added to the test adapter board, allowing two or more signals to the memory module under test to be skewed relative to each other. A it sequencer could be added to the test adapter board to automatically sequence Vcc and the clock skew once a test is started or power is applied when a new module is inserted. Values can be specified in a variety of ways, both directly and indirectly. Margins rather than actual voltage or delay values can be specified, or even encoded.

The abstract of the disclosure is provided to comply with the rules requiring an abstract which will allow a searcher to quickly ascertain the subject matter of the technical disclosure of any patent issued from this disclosure. It is submitted with the understanding that it will not be used to interpret or limit the scope or meaning of the claims. 37 C.F.R. § 1.72(b). When the word "means" is recited in a claim element, Applicant intends for the claim element to fall under 35 USC § 112, paragraph 6. Often a label of one or more words precedes the word "means". The word or words proceeding the word "means" is a label intended to ease referencing of claims elements and is not intended to convey a structural limitation. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A test system for margin-testing memory modules comprising:

a motherboard, the motherboard being a main board for a computer using memory modules as a memory, the motherboard containing a processor for executing a test program that writes and reads memory;

a test adaptor board, mounted to the motherboard, the test adaptor board having a test socket for connecting memory modules for testing by the motherboard, the test adaptor board for electrically connecting a memory module connected to the test socket to the motherboard attached to the test adaptor board, the motherboard using the memory module inserted into the test socket as a portion of the memory of the motherboard; and a voltage margin circuit, coupled between a power-supply and a power-supply input to the test socket, for adjusting a power-supply voltage applied to the memory module inserted into the test socket to a value that differs from the power-supply voltage on the motherboard by a voltage margin;

wherein the test program executing on the motherboard margin tests the memory module receiving a power-supply voltage that differs from the motherboard power-supply voltage by the voltage margin, whereby margin testing of the memory module is performed without altering the power-supply voltage on the motherboard.

2. The test system of claim 1 wherein the test program alters the voltage margin during execution of the test program, wherein the memory module is tested with at least two voltage margins by the test program, whereby the voltage margin is adjusted under control of the test program.

3. The test system of claim 2 further comprising:

a test controller card, inserted into an expansion-bus slot on the motherboard, for generating a control signal to the voltage margin circuit, the control signal indicating a desired voltage margin to be generated by the voltage margin circuit.

4. The test system of claim 3 wherein the test program executes write instructions that write values to programmable registers on the test controller card, the programmable registers for generating the control signal to the voltage margin circuit, whereby the test program adjusts the voltage margin by writing to the programmable registers.

5. The test system of claim 1 further comprising:

a delay margin circuit, coupled between a memory clock on the motherboard and a clock input to test socket for driving a memory clock to the memory module being tested, the delay margin circuit adjusting a phase delay of the memory clock to the test socket, whereby the phase delay is adjusted for margin testing of the memory module.

6. The test system of claim 5 wherein the delay margin circuit comprises a phase-locked loop (PLL), delay buffers, and a mux for selecting an output from one of the delay buffers.

7. The test system of claim 5 wherein setup and hold times from address inputs to the test socket are adjusted by the phase delay of the memory clock adjusted by the delay margin circuit, whereby address setup and hold margins are tested.

8. The test system of claim 7 wherein the delay margin circuit is mounted on the test adaptor board.

9. The test system of claim 7 wherein the delay margin circuit is a clock chip mounted on the motherboard, the clock chip also for generating a processor clock to the processor on the motherboard that executes the test program;

wherein the test program writes to the clock chip to adjust the memory clock to the test socket to adjust the phase delay.

10. The test system of claim 9 wherein the motherboard has a component side and a solder side, the component side having integrated circuits mounted thereon and expansion sockets for expansion boards;

wherein the test adaptor board is mounted above the solder side of the motherboard.

11. The test system of claim 10 further comprising:

pins coupled between the motherboard and the test adaptor board, the pins being mounted into holes on the motherboard for a removed memory-module socket;

wherein the power-supply voltage on the motherboard is coupled to the voltage margin circuit by at least one of the pins.

12. A method for margin testing memory modules using a motherboard-based tester comprising:

executing a test program on a motherboard;

specifying a first test power-supply voltage that differs from a nominal power-supply voltage on the motherboard by a first voltage margin;

applying the first test power-supply voltage to a memory module under test, the memory module under test being connected to a memory bus on the motherboard by a test adapter board with a test socket for connecting to the memory module under test;

the test program executing instructions to write to the memory module under test and to read from the memory module under test, when the memory module under test has the first test power-supply voltage applied;

specifying a second test power-supply voltage that differs from the nominal power-supply voltage on the motherboard by a second voltage margin, the second voltage margin differing from the first voltage margin;

applying the second test power-supply voltage to the memory module under test; and the test program executing instructions to write to the memory module under test and to read from the memory module under test, when the memory module under test has the second test power-supply voltage applied, whereby the memory module under test is tested at two different voltage margins.

13. The method of claim 12 further comprising:

specifying a first phase delay;

adjusting a phase delay of a control signal to the memory module under test in response to the first phase delay to generate a first delayed control signal;

applying the first delayed control signal to the memory module under test when the test program executes instructions to write to the memory module under test and to read from the memory module under test;

specifying a second phase delay;

adjusting the phase delay of the control signal to the memory module under test in response to the second phase delay to generate a second delayed control signal;

applying the second delayed control signal to the memory module under test when the test program executes instructions to write to the memory module under test and to read from the memory module under test, whereby the memory module under test is tested at two different phase-delay margins.

14. The method of claim 13 wherein specifying the first and second phase delays comprises specifying the first and second phase delays to meet or exceed setup and hold time specifications of address, data, or other control signals to the memory module under test, whereby setup and hold margins are tested.

15. The method of claim 14 wherein the test program executes instructions to write values to programmable registers to specify the first and second phase delays and the first and second test power-supply voltage, whereby margins are changed under program control.

16. A memory-module margin tester comprising:

test adapter board means for electrically connecting to a memory module under test;

motherboard means for executing a test program means for testing the memory module under test, the motherboard means including expansion-bus means for accepting expansion cards, and memory means for storing data, the memory means including local memory means for storing data on the motherboard means, and a connection means for connecting the memory means to the memory module under test through the test adapter board means; and voltage margin means, coupled to the test adapter board means, for varying a power-supply voltage to the memory module under test in response to the test program means, the voltage margin means not adjusting a power-supply voltage to the local memory means;

whereby the power-supply voltage to the memory module under test is varied in response to the test program means during margin testing.

17. The memory-module margin tester of claim 16 further comprising:

phase margin means, coupled to the test adapter board means, for varying a phase of a signal to the memory module under test in response to the test program means, the phase margin means not adjusting a phase of a signal to the local memory means;

whereby the phase to the memory module under test is varied in response to the test program means during margin testing.

18. The memory-module margin tester of claim 17 wherein the phase margin means comprises a phase-locked loop (PLL), the signal being a clock signal.

19. The memory-module margin tester of claim 18 wherein the test program means further comprises means for generating a select signal to the phase margin means, the select signal selecting a clock phase from among a plurality of clock phases generated by the phase margin means.

20. The memory-module margin tester of claim 19 wherein the memory module under test is a single-inline memory module SIMM or a dual-inline memory module DIMM or a RAMBUS module or a double-data rate (DDR) module.

* * * * *